(12) United States Patent
Mihashi et al.

(10) Patent No.: US 6,768,760 B2
(45) Date of Patent: Jul. 27, 2004

(54) RIDGE-WAVEGUIDE SEMICONDUCTOR LASER DEVICE

(75) Inventors: Yutaka Mihashi, Tokyo (JP); Tohru Takiguchi, Tokyo (JP); Yoshihiko Hanamaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 16 days.

(21) Appl. No.: 10/260,280

(22) Filed: Oct. 1, 2002

(65) Prior Publication Data

US 2003/0179794 A1 Sep. 25, 2003

(30) Foreign Application Priority Data

Mar. 19, 2002 (JP) .................................... 2002-076913

(51) Int. Cl.[7] ................................................ H01S 5/00
(52) U.S. Cl. ........................................ 372/46; 372/45
(58) Field of Search .............................. 372/45–46, 44, 372/49, 48

(56) References Cited

U.S. PATENT DOCUMENTS

| | | | |
|---|---|---|---|
| 4,869,568 A | * | 9/1989 | Schimpe .................... 385/14 |
| 5,381,434 A | | 1/1995 | Bhat et al. |
| 5,825,797 A | * | 10/1998 | Nagai .......................... 372/46 |
| 6,287,884 B1 | * | 9/2001 | Jie et al. ....................... 438/39 |
| 6,359,921 B1 | * | 3/2002 | Yamanaka .................... 372/49 |
| 6,529,537 B2 | * | 3/2003 | Yamanaka .................... 372/49 |
| 2002/0061044 A1 | * | 5/2002 | Kuniyasu et al. ............. 372/48 |
| 2002/0146051 A1 | * | 10/2002 | Kuniyasu et al. ............. 372/46 |

* cited by examiner

Primary Examiner—Wilson Lee
Assistant Examiner—Hung Tran Vy
(74) Attorney, Agent, or Firm—Leydig, Voit & Mayer, Ltd.

(57) ABSTRACT

A laser device includes a double hetero-structure element constructed by depositing a p-type cladding layer, a quantum well active layer, an n-type thin first cladding layer and an n-type thick second cladding layer sequentially. A ridge-waveguide is shaped between two trenches formed in the second cladding layer. The first cladding layer serves as an etching stopper while etching the second cladding layer to form the two trenches. The trenches reach to or reach in vicinity to the surface of the first cladding layer. High-resistance regions may be formed in portions of the first cladding layer directly underneath the trenches. The thin first cladding layer, suppresses leakage current and improves the temperature characteristics and the operating speed characteristics of the laser device.

6 Claims, 5 Drawing Sheets

RIDGE-WAVEGUIDE SEMICONDUCTOR LASER DEVICE

BACKGROUND OF THE INVENTION

1. Field of the Invention

The present invention relates to a ridge-waveguide semiconductor laser device used for optical communications and so on, which has improved temperature characteristics and high-speed operating characteristics.

2. Background Art

In recent years, optical fiber networks have been popularized rapidly and the use of communication semiconductor laser devices spreads from trunk lines to subscriber loops. Further, in accordance with rapid popularization of the Internet and development of computer networks, the necessity of higher speed LANs (Local Area Networks) using optical fibers has increased. The semiconductor laser device for data communication, that is the key device of optical fiber networks, is required to have better temperature characteristics and to operate at higher speed. The semiconductor laser device that operates at a high speed and at a high temperature without adding a special cooling device is indispensable, to reduce the cost of optical communication equipments using the device.

FIG. 6 and FIG. 7 show the conventional ridge-waveguide semiconductor laser device. FIG. 6 is a perspective view showing the conventional ridge-waveguide semiconductor laser device that employs an n-type semiconductor substrate. FIG. 7 is a perspective view showing the conventional ridge-waveguide semiconductor laser device that employs a p-type semiconductor substrate.

The ridge-waveguide semiconductor laser device shown in FIG. 6 is manufactured as follows. An n-type InP cladding layer 2n is deposited on the upper surface of a semiconductor substrate 1n, such as n-type InP substrate. Further, on the upper surface of the n-type InP cladding layer 2n, an AlGaInAs multi-quantum well active layer 3 is deposited. On the upper surface of the active layer 3, a p-type InP cladding layer 5p is deposited and formed to have three protruded ridges therein. On the upper surface of this cladding layer 5p, a p-type electrode layer 7p is deposited with a p type InGaAs contact layer 6p intercalated therebetween. Among the three protruded ridges, the central protruded ridge constitutes a ridge-waveguide 9 with an active region 10 formed in the active layer 3 located under the central protruded ridge. In addition, on the undersurface of the n-type semiconductor substrate 1n, an n-type electrode layer 8n is deposited.

Generally, a series resistance Rd is one of the elements that governs the temperature characteristics of the laser device. As this series resistance Rd becomes small, the generated Joule heat decreases, that leads to better temperature characteristics. Further, the series resistance Rd is also one element that determines the operating speed of the semiconductor laser device. The smaller the series resistance Rd is, the smaller the RC time constant becomes, that leads to better frequency response. Therefore, the series resistance Rd is preferably as small as possible in order to improve the operating speed of the device.

Since the conventional ridge-waveguide semiconductor laser device in FIG. 6 is constructed using the n-type semiconductor substrate 1n, the cladding layer 5p constituting the ridge-waveguide 9 is formed inevitably using a p-type semiconductor, for example, p-type InP or p-type InGaAs. However, as the majority carrier of the p-type semiconductors is holes, its resistivity is about ten times higher than the resistivity of n-type semiconductors. Therefore, the conventional semiconductor laser device shown in FIG. 6 has a larger resistance in the portion of the ridge-waveguide 9 close to the active region 10 above the n-type semiconductor substrate 1n, thus the series resistance Rd of the device is large. This large resistance causes the heat generation and the large RC time constant, which offers a disadvantage in improving the temperature characteristics and the operating speed characteristics.

FIG. 7 shows a conventional ridge-waveguide semiconductor laser device that aims to solve this problem. This device is constructed using a p-type semiconductor substrate 1p, and is manufactured as follows. A p-type InP cladding layer 2p is deposited on the upper surface of the p-type semiconductor substrate 1p such as InP. Further the AlGaInAs multi-quantum well active layer 3 is deposited thereon. On the upper surface of this active layer 3, an n-type InP cladding layer 5n is deposited and formed to have three protruded ridges. On the upper surface of this cladding layer 5n, an n-type electrode layer 7n is deposited with an n-type InGaAs contact layer 6n intercalated therebetween. Among three protruded ridges, the central protruded ridge constitutes the ridge-waveguide 9, and the active region 10 is formed in the active layer 3 under the central protruded ridge. In addition, on the undersurface of the p-type semiconductor substrate 1p, a p-type electrode layer 8p is deposited.

In the ridge-waveguide semiconductor laser device including the p-type semiconductor substrate 1p shown in FIG. 7, the ridge-waveguide 9 is composed of the n-type InP cladding layer 5n and the n-type InGaAs contact layer 6n. Thus the series resistance Rd for a current passing through the ridge-waveguide 9 should be reduced. Hence the temperature characteristics and the operating speed characteristics are expected to be improved. However, in reality, the temperature characteristics are not sufficiently improved. In the device, a comparatively thick portion of the n-type InP cladding layer 5n remains between the ridge-waveguide 9 and the active region 10. This thick portion should be left for avoiding an excess of etching in the etching process to shape three protruded ridges in the InP cladding layer 5n. This comparatively thick portion of the cladding layer 5n left between the ridge-waveguide 9 and the active region 10 gives rise to a large leakage current passing through that portion. This large leakage current causes an oscillation threshold current to increase, and accordingly leads to larger heat generation. Therefore, the temperature characteristics deteriorate.

SUMMARY OF THE INVENTION

This invention proposes a ridge-waveguide semiconductor laser device using the p-type semiconductor substrate that achieves improvement in the temperature characteristics and the operating speed characteristics.

According to the present invention a ridge-waveguide semiconductor laser device includes a p-type semiconductor substrate, a p-type cladding layer, a quantum well active layer, an n-type thin first cladding layer, an n-type thick second cladding layer which is made of different semiconductor materials from the first cladding layer, and two trenches formed in the second cladding layer that shape a ridge-waveguide between the two trenches. Each of the trenches reaches to or reaches in vicinity to the surface of the first cladding layer.

Other and further objects, features and advantages of the invention will appear more fully from the following description.

BRIEF DESCRIPTION OF THE DRAWINGS

The present invention will be more apparent from the following detailed description, when taken in conjunction with the accompanying drawings, in which.

DETAILED DESCRIPTION ON THE PREFERRED EMBODIMENTS

First Embodiment

Figure 1A:
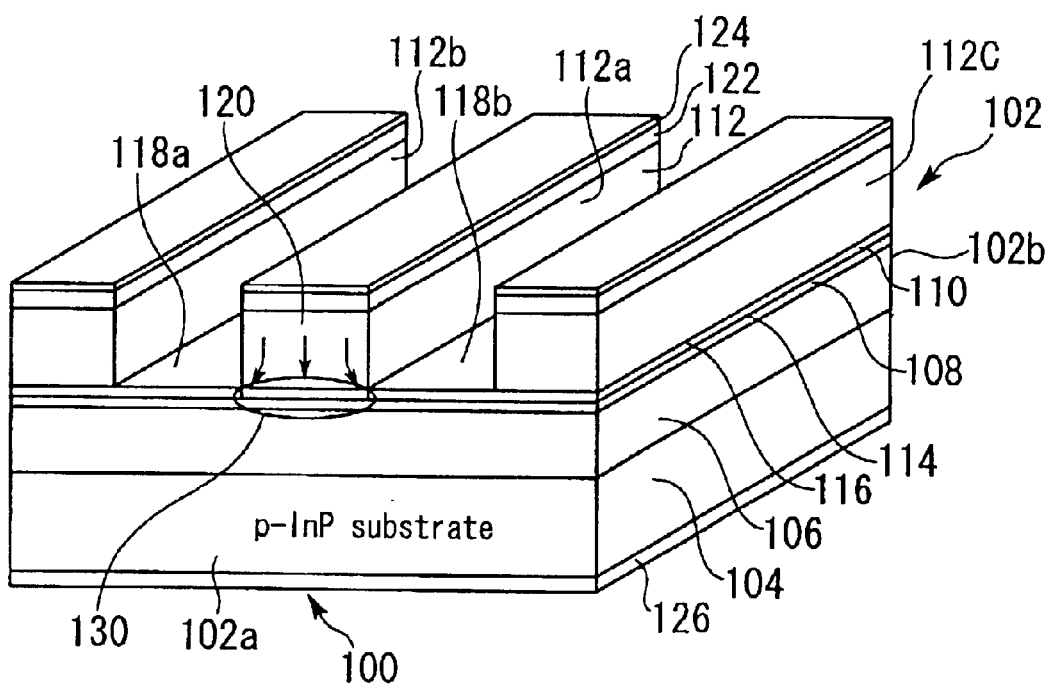
FIGS. 1A and 1B are views showing a ridge-waveguide semiconductor laser device according to a first embodiment of the present invention.
Figure 1B:
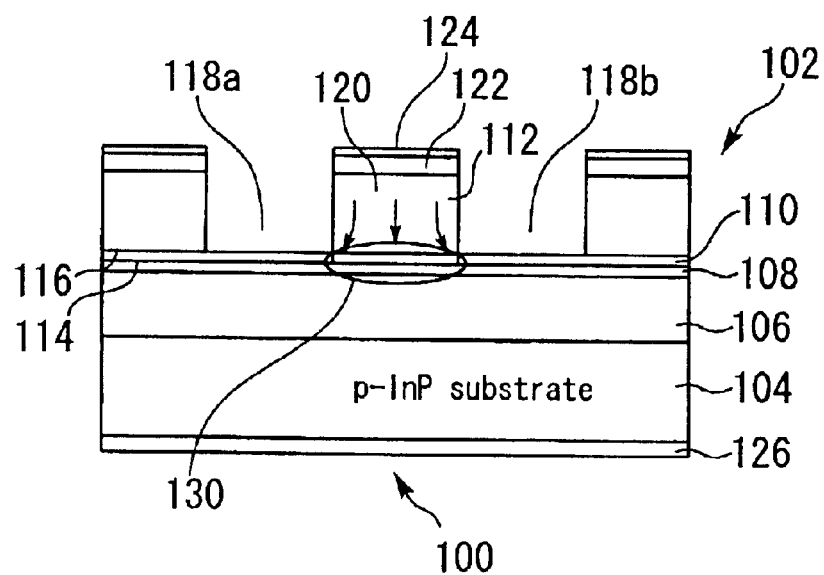

FIGS. 1A and 1B are views showing a ridge-waveguide semiconductor laser device according to a first embodiment of the present invention. FIG. 1A is a perspective view thereof and FIG. 1B is a cross-sectional view thereof.

The first embodiment is a ridge-waveguide semiconductor laser device 100 that uses the p-type semiconductor substrate. The ridge-waveguide semiconductor laser device 100 has a double hetero-structure element 102. The double hetero-structure element 102 includes a pair of mutually opposing facets 102a, 102b, and is constructed using a p-type semiconductor substrate 104. The semiconductor substrate 104 is, for example, a square p-type InP substrate having a thickness of 250 to 350 $\mu$m. On all over the upper surface of the semiconductor substrate 104, a p-type InP cladding layer 106 is deposited to a thickness of 1 to 2 $\mu$m.

On all over the upper surface of the cladding layer 106, an active layer such as an AlGaInAs-based multi-quantum well active layer 108 is deposited. A total thickness of this active layer 108 is 60 to 115 nm. This active layer 108 is composed, for example, in such a way that five well layers are respectively sandwiched in between six barrier layers. In this case, each well layer has a thickness of, for example, 5 nm, each barrier layer has a thickness of 10 nm, and thus a total thickness of the active layer 108 is 85 nm. Further, on all over the upper surface of this active layer 108, an n-type thin first cladding layer 110 is deposited. This first cladding layer 110 is, for example, an AlInAs layer. AlGaInAs with a high Al content may be used as the first cladding layer 110. The thickness of the first cladding layer 110 is in a range of 50 to 300 nm. In this embodiment, an AlInAs layer has a thickness of 100 nm. On the upper surface of the first cladding layer 110, an n-type thick second cladding layer 112 is deposited. The second cladding layer 112 is, for example, an n-type InP layer. The thickness of the second cladding layer 112 is 1 to 2 $\mu$m.

This double hetero-structure element 102 has a double hetero-junction. A first hetero-junction 114 is formed between the active layer 108 and the first cladding layer 110, and a second hetero-junction 116 is formed between the first cladding layer 110 and the second cladding layer 112. Thus, a double hetero-structure is constructed with the active layer 108, the first cladding layer 110, and the second cladding layer 112.

The second cladding layer 112 is etched to form three mutually parallel protruded ridges 112a, 112b and 112c. The protruded ridges 112b and 112c are arranged on both sides of the central protruded ridge 112a. These protruded ridges 112a, 112b and 112c elongate from the facet 102a to the facet 102b in a mutually parallel manner, and cross sections of these ridges intersecting a direction of the elongation are rectangle. A stripe-like trench 118a is formed between the protruded ridge 112a and protruded ridge 112b adjoining each other, and a stripe-like trench 118b is formed between the protruded ridge 112a and the protruded ridge 112c, respectively. The first cladding layer 110 is exposed at bottoms of these trenches 118a and 118b. The central protruded ridge 112a constitutes a ridge-waveguide 120.

On each upper surface of the three protruded ridges 112a, 112b and 112c, an n-type InGaAs contact layer 122 is deposited to a thickness of 0.2 to 0.5 $\mu$m, and an n-type electrode layer 124 makes ohmic contact to each of the protruded ridges 112a, 112b and 112c through the contact layer 122. On all over the undersurface of the p-type semiconductor substrate 104, a p-type electrode layer 126 is deposited and makes ohmic contact to the p-type semiconductor substrate 104.

In the active layer 108 underneath the ridge-waveguide 120, an active region 130 is formed. Increase in the resistance along a direction from the ridge-waveguide 120 to the active region 130 is stemmed off, though the first cladding layer 110 exists between the active region 130 and the ridge-waveguide 120, because a thickness of the first cladding layer 110 is as thin as 100 nm.

The three protruded ridges 112a, 112b and 112c of the n-type second cladding layer 112 are shaped as follows. First, an n-type AlInAs layer that will be the second cladding layer 112 and an n-type InGaAs layer that will be the contact layer 122 are deposited on all over the upper surface of the first cladding layer 110. Subsequently the stripe-like trenches 118a and 118b are formed by etching on the AlInAs layer and the InGaAs layer, whereby the protruded ridges are shaped. The stripe-like trenches 118a and 118b are formed so as to reach the first cladding layer 110, so that the three protruded ridges 112a, 112b and 112c are shaped mutually separated.

Etching for forming the stripe-like trenches 118a and 118b includes a first etching process for a preliminary step and a second etching process for a final step. The first etching process employs dry etching such as a nonselective RIE (Reactive Ion Etching) method that can etch both the AlInAs layer constituting the second cladding layer 112 and the InGaAs layer constituting the contact layer 122. In this first etching process, the second cladding layer 112 is etched down to a point halfway through its thickness. For example, the second cladding layer 112 is etched down to a point corresponding to 70 to 80% of its thickness in the first etching process.

After the first etching process, the remains of the second cladding layer 112 is etched in the second etching process. This second etching process employs wet etching with the use of an etchant such that an etching rate for AlInAs constituting the first cladding layer 110 is slow compared to the etching rate for InP constituting the second cladding layer 112. A mixed-solution of hydrochloric acid and phosphoric acid, for example, is used as the etchant. This etchant has an etching rate for AlInAs that is slower by an order of magnitude or more than that for InP.

Therefore, at a stage in which the etching reaches the first cladding layer 110, the etching rate decreases drastically and the second etching process is virtually halted at this stage. The first cladding layer 110 acts as an etching stopper in the second etching process. As a result of halt of the second etching process due to the first cladding layer 110 acting as the etching stopper, the first cladding layer 110 is exposed at the bottoms of the stripe-like trenches 118a and 118b. The thickness of the first cladding layer 110 at the bottoms of these stripe-like trenches 118a, 118b can be controlled excellently with controllability of 100 nm or less. Though the first cladding layer 110 is used as the etching stopper, the InP layer may be often left slightly on the top of the first cladding layer 110 at the bottoms of the stripe-like trenches 118a and 118b due to an error in etching time or other errors. However, an effect remains basically unchanged that the second cladding layer 112 can be etched down to a sufficient thickness by virtue of existence of the first cladding layer 110.

Thus, according to the first embodiment of the present invention, the thickness of the first cladding layer 110 at the bottoms of the stripe-like trenches 118a and 118b can be controlled to be as thin as 100 nm or less. Consequently, a current passing into the upper side of the active region 130 from the outside of the active region 130 through the first cladding layer 110 underneath the ridge-waveguide 120, namely the leakage current that does not contribute to laser oscillation, can be made small effectively. In FIGS. 1A and 1B, a flow of electrons in the upper side of the active region 130 is indicated by the arrows for the sake of convenience. Naturally, the current flows in a direction reverse to the flow of electrons.

The operation of the device according to the first embodiment will be described. An operating voltage is applied to the electrode layer 126 and layer 124 so that the p-type electrode layer 126 serves as a positive electrode and the n-type electrode layer 124 serves as a negative electrode. By applying the operating voltage, electrons concentrate into the active region 130 directly underneath the ridge-waveguide 120 through the ridge-waveguide 120, and at the same time holes drift into the active region 130 from the p-type semiconductor substrate 104. When the current is increased to reach a quantity equal to or more than the threshold current, laser oscillation occurs in the active region 130. This operation is the same as the conventional semiconductor laser device.

According to the first embodiment, the flow of electrons drifting from the upper side of the active region 130 toward the outsides thereof through the first cladding layer 110 is controlled to be reduced by the thin first cladding layer 110 at the bottoms of the stripe-like trenches 118a and 118b, thus, the leakage current bypassing the active region 130 is restricted to a small amount. Since the first cladding layer 110 on the active region 130 has a small thickness, increase in the series resistance comes off with a slight amount and also absorption of the laser light is small.

In addition, according to the first embodiment, since the ridge-waveguide 120 is composed of n-type layers, that are the n-type first cladding layer 110 and n-type second cladding layer 112, the resistivity of a section of the ridge-waveguide 120 can be reduced to approximately one tenth of that of the conventional ridge-waveguide semiconductor laser device whose ridge-waveguide is composed of p-type layers on the n-type semiconductor substrate. Therefore, heat generation caused by a resistance at the section of the ridge-waveguide 120 becomes small considerably, and hence the temperature characteristics of the laser device can be improved. Further, the RC time constant becomes small to make the frequency response fast, because the overall resistance of the laser device becomes small. Therefore the operating speed characteristics can be improved, and high-speed modulation is realized. Moreover, according to the first embodiment, the AlGaInAs-based quantum well is employed as the active layer 108, thus the temperature characteristics, operating speed characteristics, and modulation speed characteristics are improved compared to the conventional semiconductor laser device that employs InGaAsP-based quantum wells.

Second Embodiment

Figure 2:
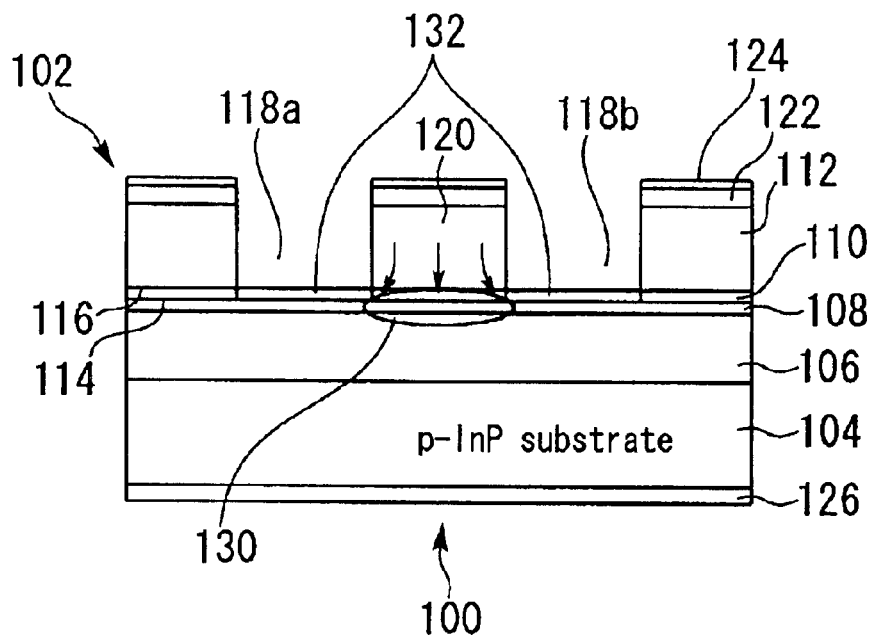
FIG. 2 is a cross-sectional view showing the ridge-waveguide semiconductor laser device according to a second embodiment.

FIG. 2 is a cross-sectional view showing the ridge-waveguide semiconductor laser device according to a second embodiment of the present invention. The laser device in the second embodiment has high-resistance regions 132 resulting from lattice defect in the portions exposed at the bottoms of the stripe-like trenches 118a and 118b of the first cladding layer 110. The device according to the second embodiment has almost the same structure as the device in the first embodiment except the above-mentioned point. Any part corresponding to a counterpart of the first embodiment is designated by the same reference number as the first embodiment.

The high-resistance regions 132 are formed by implanting ions of an inactive element such as H (hydrogen), He (helium) or Ar (argon) from the stripe-like trenches 118a, 118b toward the first cladding layer 110. In this ion implantation process, acceleration energy of ions is set to such a degree that neither implanted ions of this element nor a peak of lattice defects introduced by the implantation of this element in the first cladding layer 110 reaches the quantum well active layer 108, and as a result the high-resistance regions 132 are formed in a limited range comparable to the thickness of the first cladding layer 110. When the semiconductor laser device is operated for a long period, the possibility must be considered that the lattice defects induced by the ion implantation would increase in number and impair the reliability of the semiconductor laser device. Therefore, the high-resistance regions 132 are restricted in a range comparable to the thickness of the first cladding layer 110 to prevent a decline in the reliability. The high-resistance regions 132 are preferably formed all over the thickness of the first cladding layer 110, though almost the same effect can be expected when the high-resistance regions 132 are formed in a range from the surface exposed at the stripe-like trenches 118a or 118b down to a point corresponding to 70% to 80% of its thickness.

Since the lattice defects existing in the high-resistance regions 132 capture injected carriers (electrons), the number of effective carriers decreases in the regions, resulting in high resistance. Thus electrons drifting in the first cladding layer 110 decrease, and the leakage current is suppressed further. Consequently, the carriers concentrate at the active region 130 more effectively. According to the second embodiment, the threshold current can be further reduced with the suppression of the leakage current, and hence the laser becomes capable of oscillating at a higher temperature.

Third Embodiment

Figure 3:
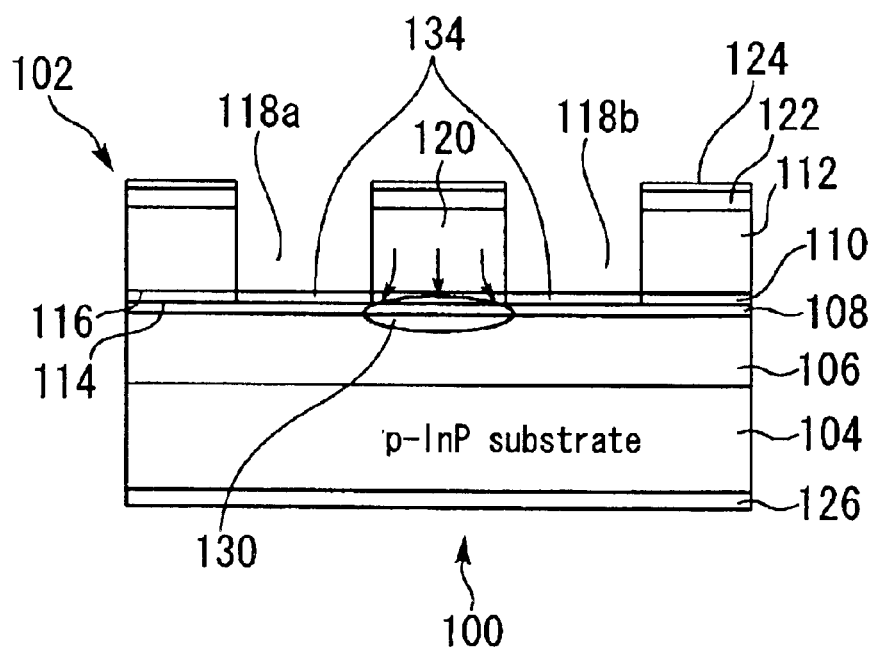
FIG. 3 is a cross-sectional view showing a ridge-waveguide semiconductor laser device according to a third embodiment.

FIG. 3 is a cross-sectional view showing a ridge-waveguide semiconductor laser device according to a third embodiment of the present invention. The laser device in the third embodiment has high-resistance regions resulting from introduction of F (fluorine) to the portions exposed at the bottoms of the stripe-like trenches 118a and 118b of the first cladding layer 110. The device according to the third embodiment has almost the same structure as the device in the first embodiment except the above-mentioned point. Any part corresponding to a counterpart of the first embodiment is designated by the same reference number as the first embodiment.

It is known that when F is introduced into the n-type AlInAs layer constituting the first cladding layer 110, F inactivates Si (silicon) element or S (sulfur) element, which is an n-type impurity, in the portion where F was introduced, and makes the portion highly resistive. In the third embodiment, high-resistance regions 134 are formed by introducing F to the portions of the first cladding layer 110 exposed at the bottoms of the stripe-like trenches 118a and 118b. The high-resistance regions 134 are formed by first forming the stripe-like trenches 118a and 118b where the first cladding layer 110 is partially exposed, and sequentially bringing F into contact with the exposed surface of the first cladding layer 110. The high-resistance regions 134 are preferably formed all over the thickness of the first cladding layer 110. However, almost the same effect can be expected by forming the high-resistance regions 134 in a range from the surface exposed at the stripe-like trenches 118a or 118b to 70% to 80% of its thickness.

One method of forming high-resistance regions includes the steps of forming a double hetero-structure element 102 having the stripe-like trenches 118a and 118b where the first cladding layer 110 is partially exposed, and soaking the double hetero-structure element 102 in a water solution containing HF (hydrogen fluoride) or NH$_4$F (ammonium fluoride). Another method of forming high-resistance regions includes the steps of forming a double hetero-structure element 102 having the stripe-like trenches 118a and 118b where the first cladding layer 110 is partially exposed, generating a plasma in an atmosphere containing a fluoride compound gas such as CF$_4$, and exposing the double hetero-structure element 102 in the plasma.

According to the third embodiment, as well as the second embodiment, the leakage current can be further reduced and the carriers concentrate effectively at the active region 130 by forming the high-resistance regions 134 into which F was introduced. Thus it is possible to reduce the threshold current and improve the temperature characteristics.

Fourth Embodiment

Figure 4:
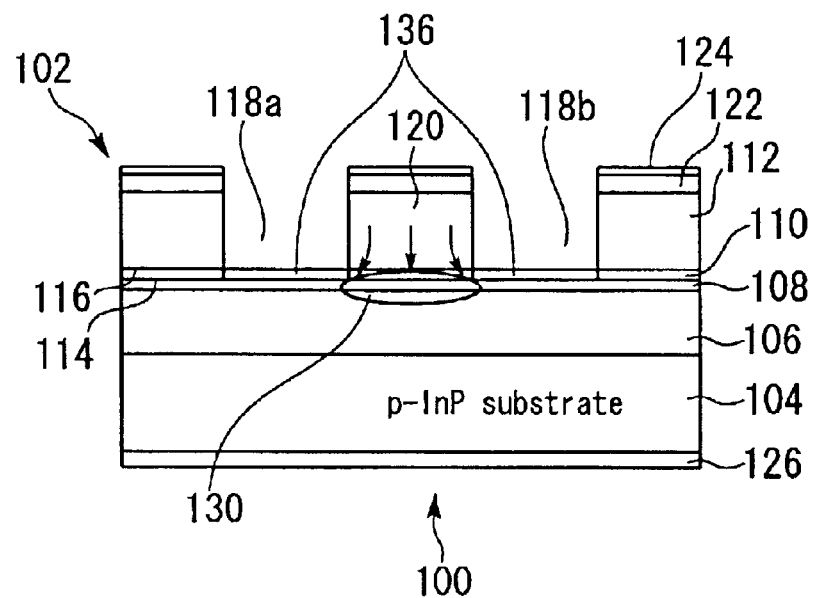
FIG. 4 is a cross-sectional view showing the ridge-waveguide semiconductor laser device according to a fourth embodiment.

FIG. 4 is a cross-sectional view of the ridge-waveguide semiconductor laser device according to a fourth embodiment of the present invention. The laser device of the fourth embodiment has high-resistance regions 136. The high-resistance regions 136 are made of an oxide film formed by oxidizing the portions exposed at the bottoms of the stripe-like trenches 118a, 118b of the first cladding layer 110. The device according to the fourth embodiment has almost the same structure as the device in the first embodiment except the above-mentioned point. Any part corresponding to a counterpart of the first embodiment is designated by the same reference number as the first embodiment.

The high-resistance regions 136 made of the oxide film are formed by heat treatment for the portions of the first cladding layer 110 exposed at the bottoms of the stripe-like trenches 118a and 118b at a high temperature in a water vapor atmosphere. The high-resistance regions 136 made of the oxide film are formed so as to exist for the whole thickness of the first cladding layer 110 or for a region from the surface thereof to a point corresponding to 70 to 80% of the total thickness. The leakage current extending over circumferences of the ridge-waveguide 120 can be controlled to be almost zero by the oxide film. As a result, the carriers concentrate efficiently at the active region 130. Hence it is possible to reduce the threshold current and improve the temperature characteristics notably.

Fifth Embodiment

Figure 5:
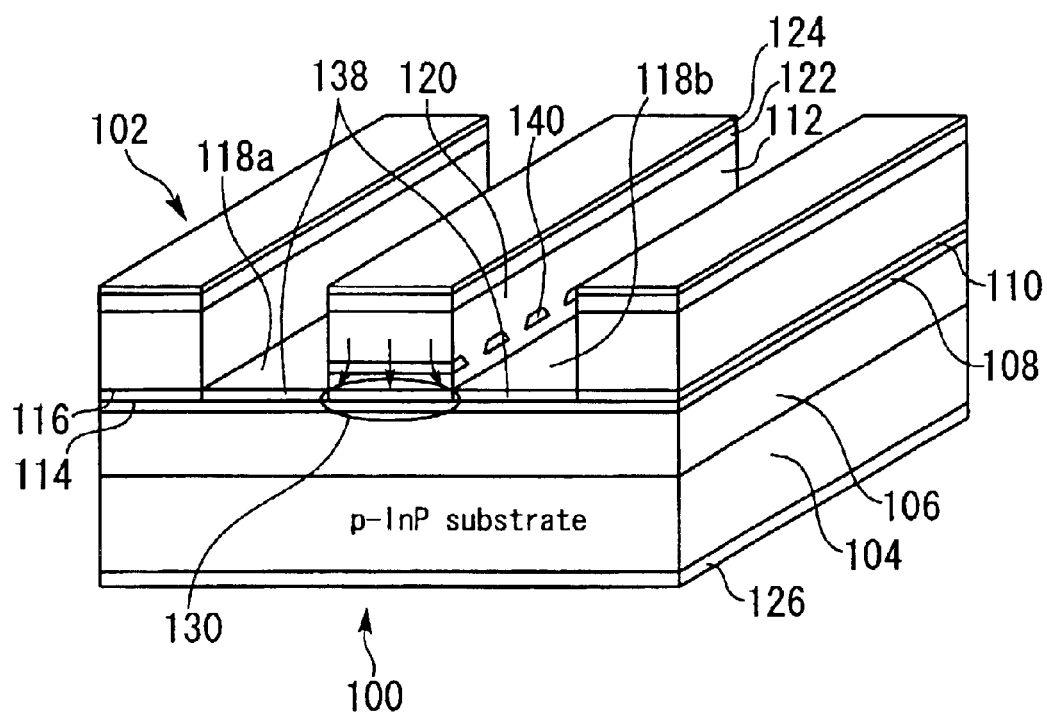
FIG. 5 is a cross-sectional view showing a semiconductor laser device, a ridge-waveguide DFB laser device according to a fifth embodiment.
Figure 6:
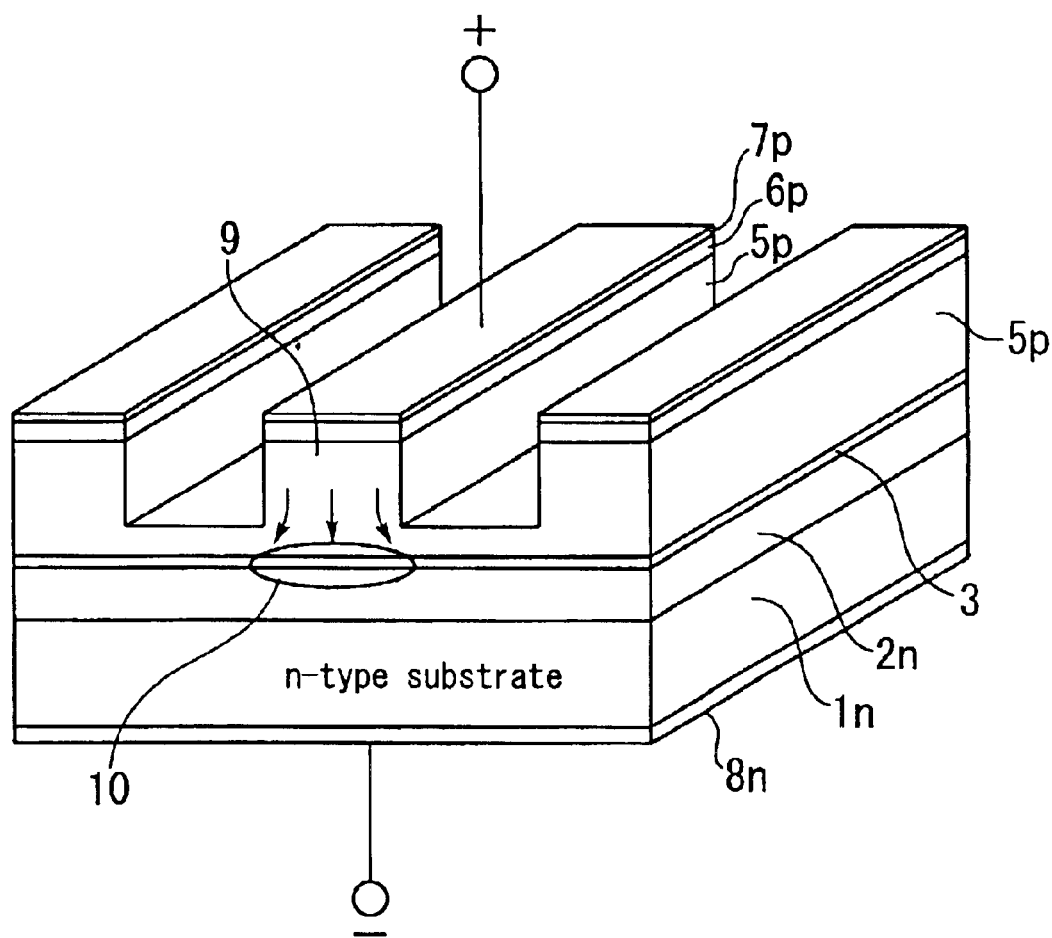
FIG. 6 and FIG. 7 show the conventional of ridge-waveguide semiconductor laser device.
Figure 7:
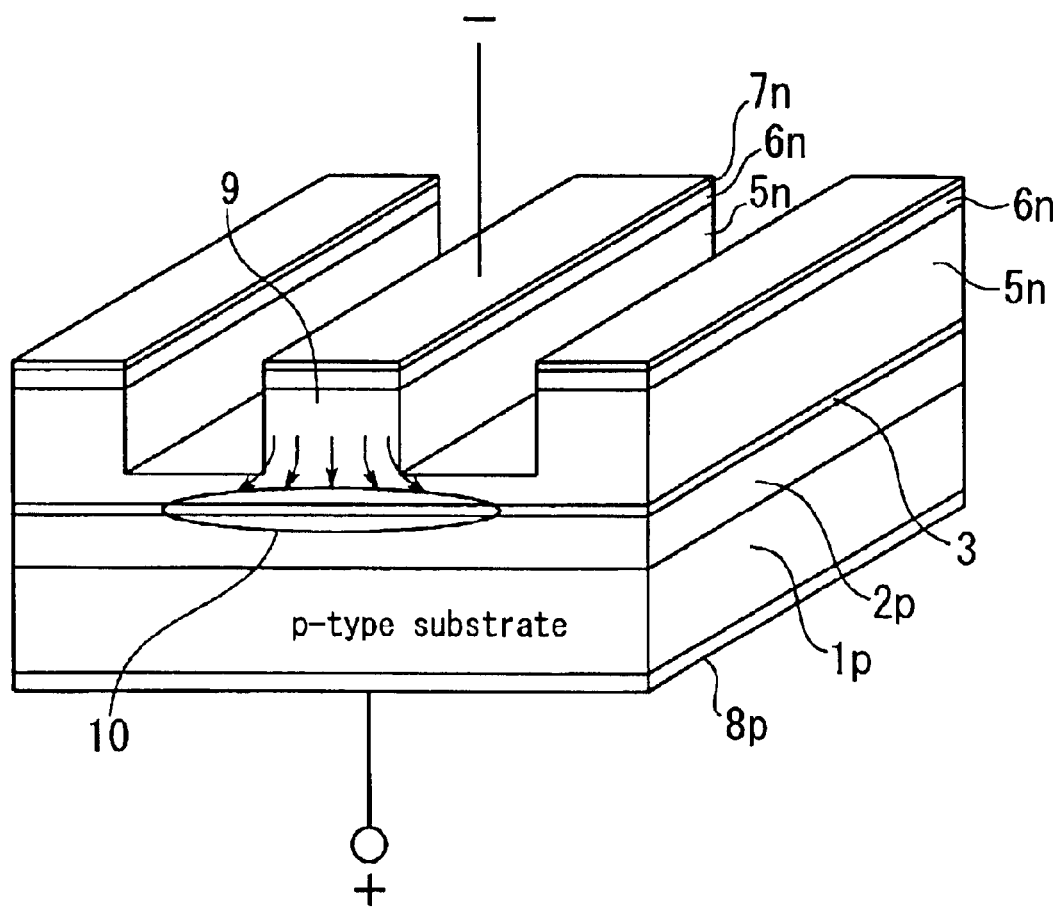

FIG. 5 is a cross-sectional view showing a semiconductor laser device, a ridge-waveguide DFB laser device, according to a fifth embodiment of the present invention. The ridge-waveguide DFB laser device according to the fifth embodiment has high-resistance regions 138 in the portions of the first cladding layer 110 exposed at the bottoms of the stripe-like trenches 118a and 118b. The laser device also has a diffraction grating 140 integrated in the ridge-waveguide 120. The laser device according to the fifth embodiment has almost the same structure as the device in the first embodiment except the high-resistance regions 138 and the diffraction grating 140. Any part corresponding to a counterpart of the first embodiment is designated by the same reference number as the first embodiment.

First, the high-resistance regions 138 are formed in the same way as one of the high-resistance regions 132, 134 and 136 shown in the second and the fourth embodiments.

The diffraction grating 140 is formed in the ridge-waveguide 120. The diffraction grating 140 includes a plurality of grate elements disposed from the facet 102a to the facet 102b with a predetermined grating pitch. The diffraction grating 140 constitutes a resonator with the active region 130 and the resonator has a predetermined distance between the diffraction grating 140 and the active region 130.

The diffraction grating 140 is made of, for example, InGaAsP and is formed in the ridge-waveguide 120 consisting of the n-type InP. The diffraction grating 140 functions so as to reflect the energy of the light generated by the active region 130 and to make the energy of the light travel back and forth in the resonator. When the current increases to the threshold value or more, the light oscillations are made at a single wavelength controlled by the predetermined grating pitch of the diffraction grating 140.

The diffraction grating 140 is constructed as a uniform diffraction grating whose grating pitch is constant from the facet 102a to the facet 102b or as a phase shift diffraction grating such that the phase of part of the uniform diffraction grating is shifted by $\lambda/4$ ($\lambda$: a wavelength of light in the medium). Especially when adopting the phase shift diffraction grating, a DFB laser device that excels in stability and repeatability in oscillating in the single longitudinal mode and operates at a high temperature stably can be realized.

According to the fifth embodiment, the DFB laser device operates in a single longitudinal mode at a high temperature, for example, up to 85° C. Further, with the high-resistance regions 138, for example, a signal-transmitting semiconductor laser device that is capable of high speed modulation of a class of 10 Gbps and is applicable to the gigabit Ethernet (registered trademark) can be realized.

Moreover, since the diffraction grating 140 is formed in the ridge-waveguide 120 composed of n-type semiconductors, even when Si, that is an n-type impurity, is deposited on a re-growth interface while performing embedding growth of the n-type InP layer after the diffraction grating 140 was formed, no high-resistance layer is formed because a Si-doped layer is of the same electric conduction type as the InP layer.

Though the foregoing embodiments are semiconductor laser devices employing the AlGaInAs-based quantum well active layer 103 deposited on the p-type InP substrate 104, the present invention can also be applied to semiconductor laser devices that employs substrates and quantum well active layers of other material systems, such as a semiconductor laser device wherein an InGaAs-based quantum well active layer is deposited on the p-type InP substrate 104, and a semiconductor laser device wherein an AlGaAs-based quantum well active layer or an InGaAs-based quantum well active layer is deposited on a p-type GaAs substrate.

For example, the p-type GaAs substrate is used as the substrate 104, the following layers are used for constituent layers: an AlGaAs layer for the p-type cladding layer 106; an AlGaAs-based quantum well active layer for the active layer 108; an extremely thin GaAs layer having a thickness of a few nanometers (nm) for the n-type first cladding layer 110; and an AlGaAs layer for the n-type second cladding layer 112.

As described above, since the ridge-waveguide semiconductor laser according to the present invention is configured in such a way that the p-type semiconductor substrate is used, both the n-type thin first cladding layer and the n-type thick second cladding layer that were made of mutually different semiconductor materials are used, and the ridge-waveguide is shaped between the two trenches formed in the second cladding layer, wherein both of the trenches were formed so as to reach the surface of the first cladding layer or its vicinity, it is possible to improve the temperature characteristics and the operating speed characteristics of the laser device while suppressing the leakage current by the thin first cladding layer.

Since the ridge-waveguide semiconductor laser according to the present invention is configured in such a way that the p-type semiconductor substrate is used, both the n-type thin first cladding layer and the n-type thick second cladding layer are used, the ridge-waveguide is shaped between the two trenches formed on the second cladding layer, wherein the first cladding layer is intended to be used as the etching stopper against the etching for forming the trenches, it is possible to improve the temperature characteristics and the high speed operating characteristics of the laser device while suppressing the leakage current by the thin first cladding layer.

Further, in the laser of the same kind whose high-resistance regions are formed in the portions of the first cladding layer directly underneath the trenches, it is possible to suppress the leakage current further by the high-resistance regions; and moreover, in the laser of the same kind wherein these high-resistance regions are formed in the first cladding layer so as not to reach the active layer, it is possible to eliminate detrimental effects of the high-resistance regions upon the active layer.

Furthermore, in the lasers of the same kind whose high-resistance regions are formed by implanting ions of an inactive element, by introducing a fluorine element, or by oxidizing the first cladding layer, it is possible to form the high-resistance regions effectively and suppress the leakage current.

Even further, in the laser of the same kind wherein the diffraction grating is formed in the ridge-waveguide, it is possible to suppress the leakage current and improve the temperature characteristics and the high speed operating characteristics of the laser device while achieving single wavelength oscillation.

It is further understood that the foregoing description is a preferred embodiment of the disclosed device and that various changes and modifications may be made in the invention without departing from the spirit and scope thereof.

The entire disclosure of a Japanese Patent Application No. 2002-076913, filed on Mar. 19, 2002 including specification, claims drawings and summary, on which the Convention priority of the present application is based, are incorporated herein by reference in its entirety.

What is claimed is:

1. A ridge-waveguide semiconductor laser device comprising:
    a p-type semiconductor substrate;
    a p-type cladding layer formed on the p-type semiconductor substrate;
    a quantum well active layer formed on the p-type cladding layer;
    an n-type first cladding layer on the quantum well active layer;
    an n-type second cladding layer on the first cladding layer, being thicker than and of a different semiconductor materials from the n-type first cladding layer; and
    two trenches in the n-type second cladding layer, defining a ridge-waveguide between the two trenches; wherein each of the trenches reaches at least proximate the surface of the n-type first cladding layer and the n-type first cladding layer includes high-resistance regions, within portions of the n-type first cladding layer, directly opposite the trenches, the high-resistance regions having an higher resistivity than other regions of the n-type first cladding layer.

2. A ridge-waveguide semiconductor laser device according to claim 1, wherein high-resistance regions do not reach the quantum well active layer.

3. A ridge-waveguide semiconductor laser device according to claim 1, wherein the high-resistance regions are formed by implanting ions of an inactivating element into the n-type first cladding layer.

4. A ridge-waveguide semiconductor laser device according to claim 1, wherein the high-resistance regions are formed by introducing fluorine into the n-type first cladding layer.

5. A ridge-waveguide semiconductor laser device according to claim 1, wherein the high-resistance regions are formed by oxidizing portions of the n-type first cladding layer.

6. A ridge-waveguide semiconductor laser device according to claim 1, including a diffraction grating in the ridge-waveguide.

* * * * *